United States Patent
Tanoue et al.

(10) Patent No.: US 12,543,522 B2
(45) Date of Patent: Feb. 3, 2026

(54) MANUFACTURING METHOD OF CHIP-ATTACHED SUBSTRATE AND SUBSTRATE PROCESSING APPARATUS

(71) Applicant: Tokyo Electron Limited, Tokyo (JP)

(72) Inventors: Hayato Tanoue, Kumamoto (JP); Yasutaka Mizomoto, Kumamoto (JP); Yohei Yamashita, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 953 days.

(21) Appl. No.: 17/772,166

(22) PCT Filed: Sep. 3, 2020

(86) PCT No.: PCT/JP2020/033410
§ 371 (c)(1),
(2) Date: Apr. 27, 2022

(87) PCT Pub. No.: WO2021/084902
PCT Pub. Date: May 6, 2021

(65) Prior Publication Data
US 2022/0406603 A1    Dec. 22, 2022

(30) Foreign Application Priority Data
Oct. 29, 2019  (JP) .................. 2019-196386

(51) Int. Cl.
*H01L 21/268* (2006.01)
*H01L 21/321* (2006.01)
(Continued)

(52) U.S. Cl.
CPC ...... *H01L 21/268* (2013.01); *H01L 21/32115* (2013.01); *H01L 21/67115* (2013.01); *H01L 21/67721* (2013.01)

(58) Field of Classification Search
CPC ............ H01L 21/268; H01L 21/32115; H01L 21/67115; H01L 21/67721; H01L 24/80;
(Continued)

(56) References Cited

U.S. PATENT DOCUMENTS 10,403,537 B2 *  9/2019  Henry ................ H10D 86/0214
11,769,685 B2 *  9/2023  Wang ................... H01L 25/0655
                                                              438/125
(Continued)

FOREIGN PATENT DOCUMENTS

JP    2011-049210 A    3/2011
JP    2015-046569 A    3/2015
(Continued)

OTHER PUBLICATIONS

International Search Report of PCT/JP2020/033410 dated Dec. 1, 2020.

*Primary Examiner* — John P. Dulka
(74) *Attorney, Agent, or Firm* — Shih IP Law Group, PLLC.

(57) ABSTRACT

A manufacturing method of a chip-attached substrate includes preparing a stacked substrate including multiple chips, a first substrate to which the multiple chips are temporarily bonded, and a second substrate bonded to the first substrate with the multiple chips therebetween; and separating the multiple chips bonded to the first substrate and the second substrate from the first substrate to bond the multiple chips to one surface of a third substrate including a device layer.

15 Claims, 10 Drawing Sheets

(51) Int. Cl.
  *H01L 21/67* (2006.01)
  *H01L 21/677* (2006.01)
(58) Field of Classification Search
  CPC .......... H01L 24/96; H01L 2221/68309; H01L 21/31053; H01L 21/6835; H01L 21/2007; H01L 21/67092; H01L 2221/68354; H01L 2221/68368; H01L 2221/68381; H01L 2224/08225; H01L 2224/96; H01L 25/04; H01L 25/18; H01L 21/568; H01L 23/3107; H01L 25/50; H01L 2224/80001
  See application file for complete search history.

(56) References Cited

U.S. PATENT DOCUMENTS

| | | | | |
|---|---|---|---|---|
| 12,288,769 | B2* | 4/2025 | Harumoto | H10H 20/857 |
| 2012/0021563 | A1* | 1/2012 | Koyanagi | H01L 23/13 |
| | | | | 156/578 |
| 2015/0050760 | A1* | 2/2015 | Imazu | H01L 24/96 |
| | | | | 438/27 |
| 2015/0251398 | A1* | 9/2015 | Deguchi | H01L 21/67109 |
| | | | | 156/349 |
| 2018/0261582 | A1* | 9/2018 | Henry | H10D 86/0214 |
| 2019/0035688 | A1* | 1/2019 | Chen | H01L 21/7813 |
| 2019/0081200 | A1* | 3/2019 | Ting | H01L 24/03 |
| 2019/0181023 | A1* | 6/2019 | Saketi | H01L 25/0753 |
| 2021/0066168 | A1* | 3/2021 | Chen | H01L 24/19 |
| 2021/0066222 | A1* | 3/2021 | Chen | H01L 21/76879 |
| 2021/0091064 | A1* | 3/2021 | Chen | H01L 24/96 |
| 2021/0098412 | A1* | 4/2021 | Haba | H01L 21/6835 |
| 2021/0098422 | A1* | 4/2021 | Elsherbini | H01L 23/5226 |
| 2021/0351159 | A1* | 11/2021 | Delacruz | H03K 19/017509 |
| 2021/0407941 | A1* | 12/2021 | Haba | H01L 24/08 |
| 2022/0262766 | A1* | 8/2022 | Chen | H01L 25/0652 |
| 2022/0293524 | A1* | 9/2022 | Tsai | H01L 23/5381 |
| 2022/0406603 | A1* | 12/2022 | Tanoue | H01L 24/96 |

FOREIGN PATENT DOCUMENTS

| | | |
|---|---|---|
| TW | 201342495 A | 10/2013 |
| WO | 2018-003602 A1 | 1/2018 |

* cited by examiner

MANUFACTURING METHOD OF CHIP-ATTACHED SUBSTRATE AND SUBSTRATE PROCESSING APPARATUS

CROSS-REFERENCE TO RELATED APPLICATIONS

This Application is a U.S. national phase application under 35 U.S.C. § 371 of PCT Application No. PCT/JP2020/033410 filed on Sep. 3, 2020, which claims the benefit of Japanese Patent Application No. 2019-196386 filed on Oct. 29, 2019, the entire disclosures of which are incorporated herein by reference.

TECHNICAL FIELD

The various aspects and embodiments described herein pertain generally to a manufacturing method of a chip-attached substrate and a substrate processing apparatus.

BACKGROUND

FIG. 20 of Patent Document 1 illustrates a manufacturing process for a chip-on-wafer. In this manufacturing process, diced first memory chips are bonded one by one to a base wafer on which a plurality of second memory chips are formed.

PRIOR ART DOCUMENT

Patent Document 1: Japanese Patent Laid-open Publication No. 2015-046569

DISCLOSURE OF THE INVENTION

Problems to be Solved by the Invention

Exemplary embodiments provide a technique enabling to suppress poor bonding between a chip and a substrate.

Means for Solving the Problems

In an exemplary embodiment, a manufacturing method of a chip-attached substrate includes preparing a stacked substrate including multiple chips, a first substrate to which the multiple chips are temporarily bonded, and a second substrate bonded to the first substrate with the multiple chips therebetween; and separating the multiple chips bonded to the first substrate and the second substrate from the first substrate to bond the multiple chips to one surface of a third substrate including a device layer.

DETAILED DESCRIPTION

Figure 1:
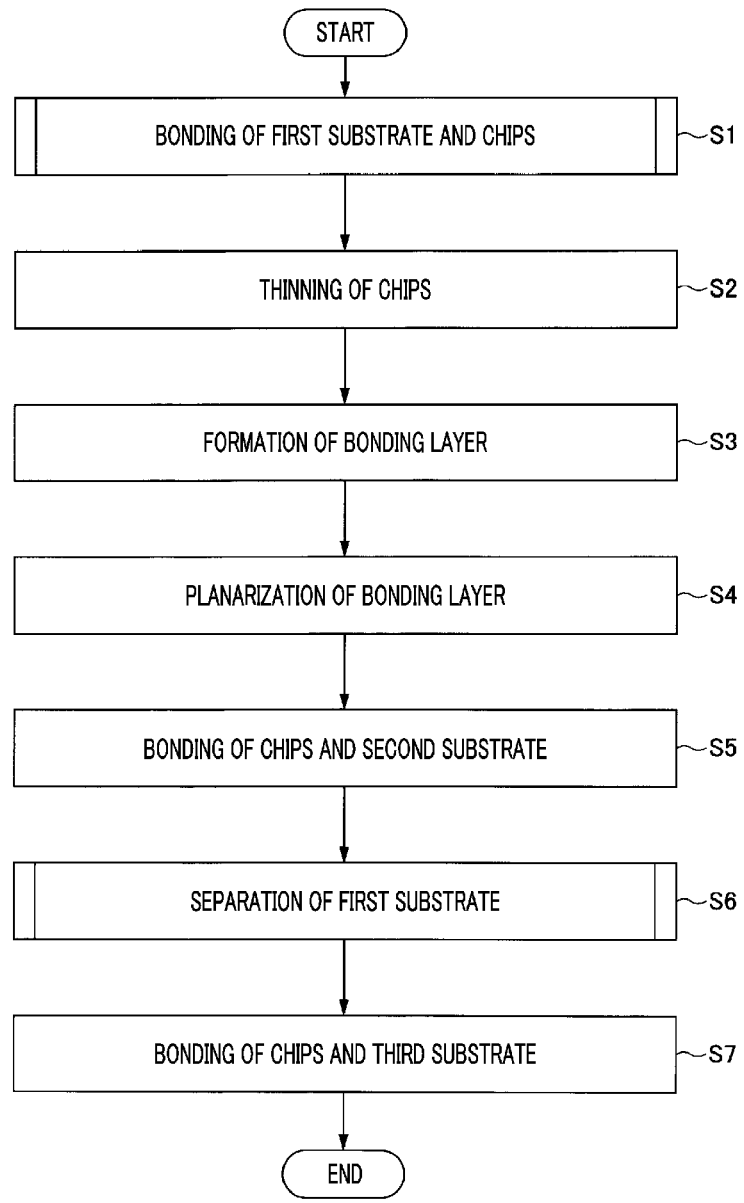
FIG. 1 is a flowchart illustrating a manufacturing method of a chip-attached substrate according to an exemplary embodiment.

Hereinafter, exemplary embodiments of the present disclosure will be described with reference to the accompanying drawings. In the various drawings, the same or corresponding parts will be assigned same reference numerals, and redundant description may be omitted.

A manufacturing method of a chip-attached substrate includes, for example, processes S1 to S7 shown in FIG. 1. The process S1 of FIG. 1 includes, for example, processes S11 to S14 shown in FIG. 2. Further, a process S6 shown in FIG. 1 includes, for example, processes S61 to S63 shown in FIG. 3.

Figure 4A:
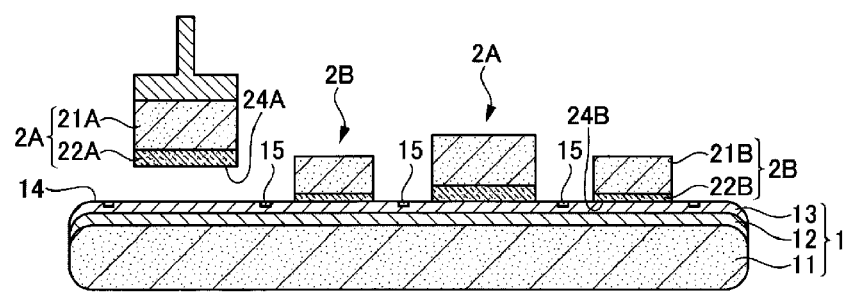
FIG. 4A is a cross sectional view illustrating a state in the middle of the process S1 of FIG. 1.
Figure 4B:
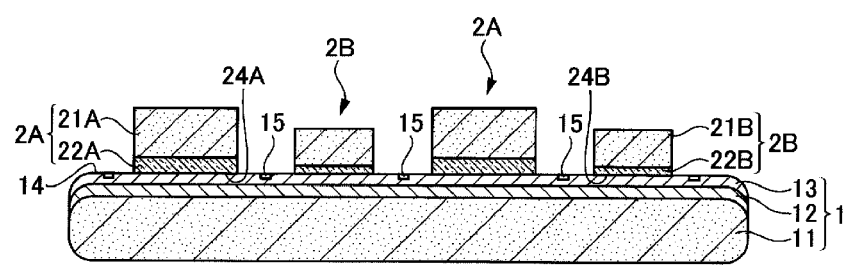
FIG. 4B is a cross sectional view illustrating a state upon the completion of the process S1 of FIG. 1.

First, in the process S1 of FIG. 1, a first substrate 1 and chips 2A and 2B are bonded, as illustrated in FIG. 4A and FIG. 4B. In a process S11 of FIG. 2 included in the process S1 of FIG. 1, the first substrate 1 and the chips 2A and 2B are prepared.

The first substrate 1 has, for example, a silicon wafer 11, an absorption layer 12, and a bonding layer 13. Here, the absorption layer 12 may serve as the bonding layer 13 as well, as will be described later. In that case, the first substrate 1 has the silicon wafer 11 and the absorption layer 12.

The absorption layer 12 is disposed between the silicon wafer 11 and the chips 2A and 2B. As will be described later in detail, a laser beam LB2 shown in FIG. 4H passes through the silicon wafer 11 to be absorbed by the absorption layer 12. Since the laser beam LB2 is absorbed by the absorption layer 12 and does not reach the chips 2A and 2B, damage to the chips 2A and 2B can be suppressed. The absorption layer 12 is, for example, a silicon oxide layer, and is formed by a thermal oxidation method, a CVD (Chemical Vapor Deposition) method, or the like.

Further, the absorption layer 12 needs to be able to absorb the laser beam LB2 just to the extent that the damage to the chips 2A and 2B can be suppressed. The absorption layer 12 may be a silicon nitride layer, a silicon carbonitride layer, or the like. The silicon nitride layer is formed by a thermal nitridation method, a CVD method, or the like. The silicon carbonitride layer is formed by a CVD method or the like.

As shown in FIG. 4A, the bonding layer 13 is disposed between the absorption layer 12 and the chips 2A and 2B, and is in contact with the chips 2A and 2B. The bonding layer 13 is, for example, an insulating layer such as a silicon oxide layer. The bonding layer 13 may be made of a material different from that of the absorption layer 12 or may be made of the same material as that of the absorption layer 12. In the latter case, the absorption layer 12 may also serve as the bonding layer 13.

The bonding layer 13 includes alignment marks 15 in a bonding surface 14 thereof bonded to the chips 2A and 2B. The alignment marks 15 are imaged with a camera or the like, and are used for position control of the chips 2A and 2B. Further, the position of the alignment marks 15 is not limited to being in the bonding surface 14 of the bonding layer 13. By way of example, the alignment marks 15 may be provided in the absorption layer 12 or between the absorption layer 12 and the bonding layer 13.

Meanwhile, the chip 2A has a silicon wafer 21A and a device layer 22A. The device layer 22A is formed on a surface of the silicon wafer 21A. The device layer 22A includes a semiconductor device, a circuit, a terminal, and the like. After the formation of the device layer 22A, the silicon wafer 21A is diced into a plurality of chips 2A.

The chip 2B has a silicon wafer 21B and a device layer 22B, the same as the chip 2A. The device layer 22B has a function different from that of the device layer 22A, and the chip 2A and the chip 2B have different thicknesses. After the formation of the device layer 22B, the silicon wafer 21B is diced into a plurality of chips 2B.

Figure 2:
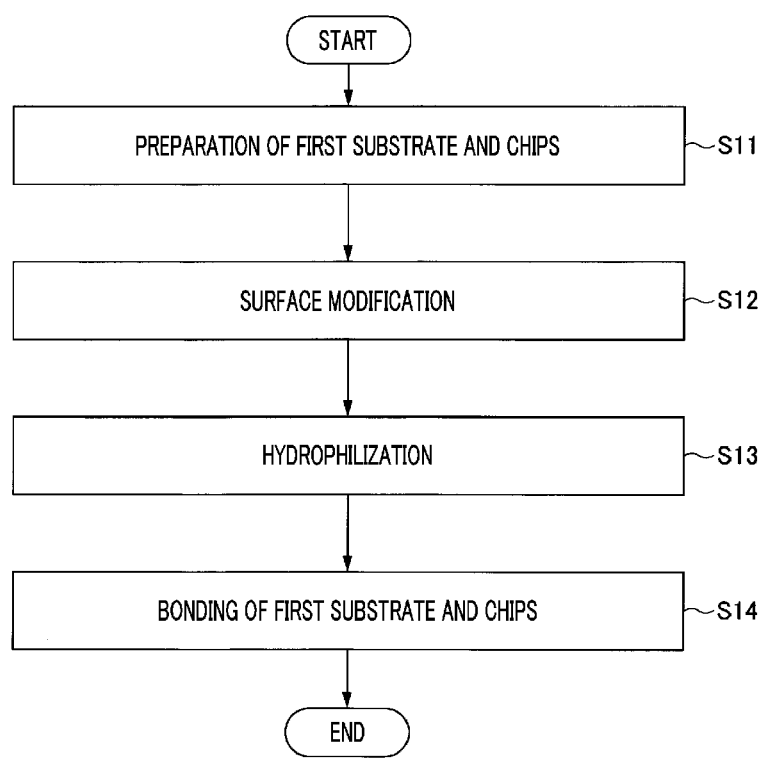
FIG. 2 is a flowchart showing details of a process S1 of FIG. 1.

In a process S12 of FIG. 2 included in the process S1 of FIG. 1, the bonding surface 14 of the first substrate 1 is modified by plasma or the like. Specifically, a $SiO_2$ bond of the bonding surface 14 is cut to form a dangling bond of Si, thus enabling to hydrophilize the bonding surface 14.

For example, in a decompressed atmosphere, an oxygen gas as a processing gas is excited into plasma to be ionized. Oxygen ions are radiated to the bonding surface 14, so that the bonding surface 14 is modified. The processing gas is not limited to the oxygen gas, but may be, by way of non-limiting example, a nitrogen gas.

In the process S12, not only the bonding surface 14 of the first substrate 1 but also bonding surfaces 24A and 24B of the chips 2A and 2B may be modified. At least either the bonding surface 14 of the first substrate 1 or the bonding surfaces 24A and 24B of the chips 2A and 2B are modified.

In a process S13 of FIG. 2 included in the process S1 of FIG. 1, the bonding surface 14 of the first substrate 1 is hydrophilized. For example, the first substrate 1 is held by a spin chuck, and pure water such as DIW (Deionized Water) is supplied onto the bonding surface 14 of the first substrate 1 being rotated along with the spin chuck. OH groups adhere to the dangling bonds of Si on the bonding surface 14, so that the bonding surface 14 is hydrophilized.

In the above-described process S13, not only the bonding surface 14 of the first substrate 1 but also the bonding surfaces 24A and 24B of the chips 2A and 2B may be hydrophilized. At least either the bonding surface 14 of the first substrate 1 or the bonding surfaces 24A and 24B of the chips 2A and 2B are hydrophilized.

In a process S14 of FIG. 2 included in the process S1 of FIG. 1, the chips 2A and 2B are temporarily bonded to the bonding surface 14 of the first substrate 1 one by one. The chips 2A and 2B are bonded to the first substrate 1 with the device layers 22A and 22B facing the first substrate 1.

The chips 2A and 2B and the first substrate 1 are bonded by a Van der Waals force (intermolecular force), a hydrogen bond between OH groups, and the like. Thereafter, in order to enhance the bonding strength, a heat treatment may be performed. The heat treatment causes a dehydration reaction. Since the solids are directly bonded to each other without using a liquid adhesive, it is possible to suppress positional deviation that might be caused by deformation of the adhesive or the like, and, also, to suppress formation of an inclination due to non-uniform thickness of the adhesive.

In the aforementioned Patent Document 1, however, the chips 2A and 2B are permanently bonded to a third substrate 6 to be described later without taking the process of temporarily bonding the chips 2A and 2B to the first substrate 1, unlike the technique of the present disclosure. Thus, when bonding the chips 2A and 2B, it is required to suppress air bubbles or foreign substances from being mixed and to perform a position control with high precision.

When the chips 2A and 2B are bonded to the third substrate 6 one by one as in the aforementioned Patent Document 1, the chips 2A and 2B may need to be transformed one by one in order to suppress the mixing of the air bubbles during the bonding. The bonding surface 24A (24B) of the chip 2A (2B) is transformed into a downwardly curved surface, and is gradually bonded to the third substrate 6 starting from a center toward a periphery thereof to finally return to a flat surface.

The transformation of the bonding surface 24A (24B) of the chip 2A (2B) into the downwardly curved surface includes fixing the periphery of the chip 2A (2B) and pressing the center of the chip 2A (2B). Since, however, the diced chips 2A and 2B are small in size, a distance between the fixed portion and the pressed portion is small. Thus, it is difficult to transform the chips 2A and 2B one by one.

According to the present exemplary embodiment, the chips 2A and 2B are temporarily bonded to the first substrate 1 and then separated from the first substrate 1. Therefore, even if the air bubbles are mixed when the chips 2A and 2B are bonded to the first substrate 1, it is not a problem. Thus, in the process S14, the bonding surfaces 24A and 24B of the chips 2A and 2B can be bonded to the bonding surface 14 of the first substrate 1 while they are maintained flat. Since the chips 2A and 2B are not transformed, the precision of the position control of the chips 2A and 2B can be improved, so that the chips 2A and 2B can be accurately placed at target positions.

Furthermore, according to the present exemplary embodiment, the chips 2A and 2B are temporarily bonded to the first substrate 1 and then separated from the first substrate 1. Therefore, even if the particles are mixed during the bonding of the chips 2A and 2B and the first substrate 1, there may be caused no problem. Thus, even if the bonding surface 14 of the first substrate 1 and the bonding surfaces 24A and 24B of the chips 2A and 2B are contaminated, it may not be a problem unless the degree of the contamination is high enough to impede the bonding. That is, the required level of cleanness may be low.

Figure 4C:
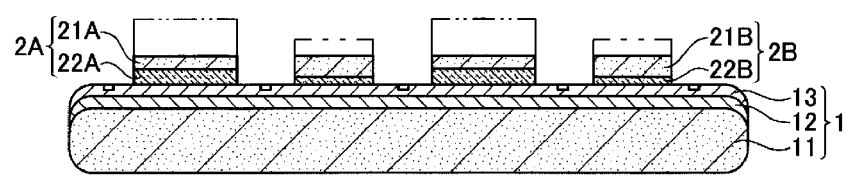
FIG. 4C is a cross sectional view illustrating a state upon the completion of a process S2 of FIG. 1.

Subsequently, in the process S2 of FIG. 1, the chips 2A and 2B are thinned to uniform the thickness thereof, as illustrated in FIG. 4C. A dashed double-dotted line in FIG. 4C indicates a state immediately before the beginning of the process S2, and a solid line indicates a state upon the completion of the process S2. In each chip 2A (2B), the silicon wafer 21A (21B) is thinned, whereas the device layer 22A (22B) is not thinned. The thinning includes grinding or laser processing.

Figure 4D:
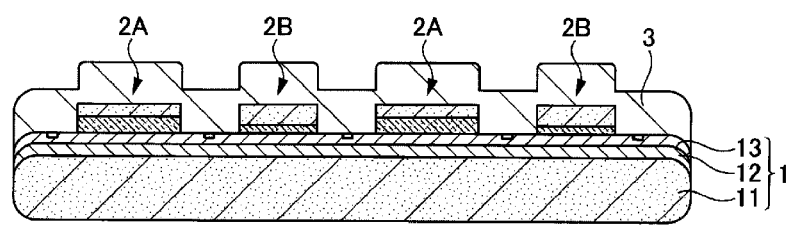
FIG. 4D is a cross sectional view illustrating a state upon the completion of a process S3 of FIG. 1.

Thereafter, in a process S3 of FIG. 1, a bonding layer 3 is formed on surfaces of the chips 2A and 2B, as shown in FIG. 4D. Like the bonding layer 13 of the first substrate 1, the bonding layer 3 is an insulating layer such as a silicon oxide layer, and is formed by a CVD method or the like. Since the chips 2A and 2B are arranged while being spaced apart from each other so that an underlying surface of the bonding layer 3 has irregularities, a front surface of the bonding layer 3 also has irregularities.

Figure 4E:
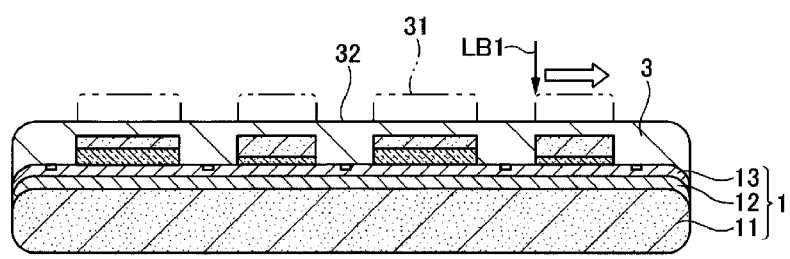
FIG. 4E is a cross sectional view illustrating a state in the middle of a process S4 of FIG. 1.
Figure 4F:
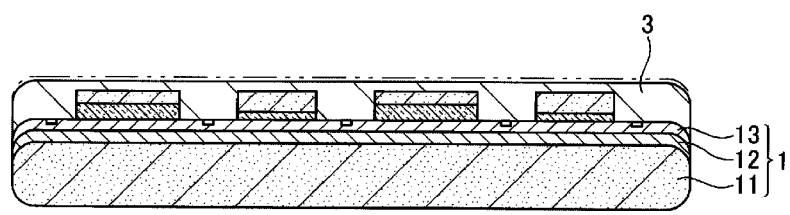
FIG. 4F is a cross sectional view illustrating a state upon the completion of the process S4 of FIG. 1.

Next, in a process S4 of FIG. 1, the surface of the bonding layer 3 is planarized, as illustrated in FIG. 4E and FIG. 4F. The bonding layer 3 is a silicon oxide layer or the like, and it has high degree of hardness. Thus, it takes time to achieve the planarization when polishing such as CMP (Chemical Mechanical Polishing) is performed.

Thus, as shown in FIG. 4E, a laser beam LB1 is radiated to a protrusion 31 of the bonding layer 3. The protrusion 31 absorbs the laser beam LB1, and is dispersed by being changed from a solid phase to a gaseous phase or dispersed while being kept in the solid phase. Further, the laser beam LB1 may also be radiated to a recess 32 of the bonding layer 3. When the radiation intensity of the laser beam LB1 to the recess 32 is lower than the radiation intensity to the protrusion 31, the surface of the bonding layer 3 can be planarized.

A radiation point of the laser beam LB1 is moved by a galvano scanner or an XYθ stage. The galvano scanner moves the laser beam LB1. The XYθ stage moves the first substrate 1 in horizontal directions (an X-axis direction and a Y-axis direction), and rotates the first substrate 1 around a vertical axis. Instead of the XYθ stage, an XYZθ stage may be used.

Next, as shown in FIG. 4F, the surface of the bonding layer 3 is further planarized by the CMP or the like. Since the protrusion 31 is already removed selectively before the CMP, it is possible to reduce unevenness left on the surface of the bonding layer 3 after the CMP.

Figure 4G:
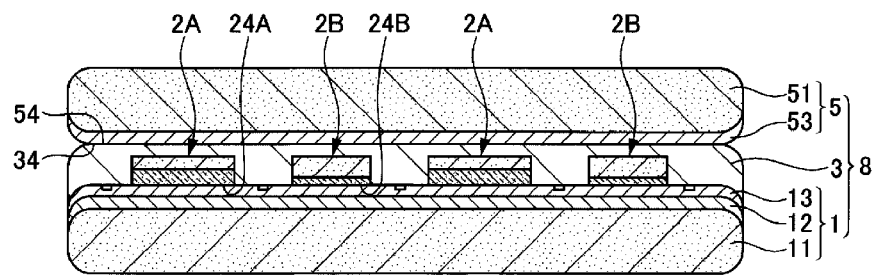
FIG. 4G is a cross sectional view illustrating a state upon the completion of a process S5 of FIG. 1.

Subsequently, in a process S5 of FIG. 1, a second substrate 5 is bonded to the chips 2A and 2B, as shown in FIG. 4G. The second substrate 5 is brought into contact with the planarized surface of the bonding layer 3 and is bonded to the chips 2A and 2B with the bonding layer 3 therebetween.

The second substrate 5 has, for example, a silicon wafer 51 and a bonding layer 53. Like the bonding layer 13 of the first substrate 1, the bonding layer 53 is an insulating layer such as a silicon oxide layer and is formed by the CVD method or the like.

At least one of a bonding surface 54 of the second substrate 5 and a bonding surface 34 of the bonding layer 3 may be subjected to the surface modification and the hydrophilization before the bonding. The second substrate 5 and the bonding layer 3 are bonded to each other by the Van der Waals force (intermolecular force), the hydrogen bond between OH groups, and the like. Since the solids are directly attached to each other without using the liquid adhesive, the positional deviation that might be caused by the deformation of the adhesive or the like can be suppressed. Furthermore, it is possible to suppress the formation of the inclination due to the non-uniform thickness of the adhesive.

The second substrate 5 is bonded to the first substrate 1 with the bonding surface 54 facing downwards and the bonding layer 3 therebetween. That is, the substrates are bonded to each other. At this time, the bonding surface 54 of the second substrate 5 is transformed into a downwardly curved surface in order to suppress the air bubbles from being mixed, and is gradually bonded starting from a center toward a periphery thereof to finally return to a flat surface.

The transformation of the second substrate 5 may be achieved by fixing the periphery of the second substrate 5 and pressing the center of the second substrate 5. When the second substrate 5 is transformed, a distance between the fixed portion and the pressed portion is wide as compared to the case where the chips 2A and 2B are transformed one by one, so the transformation is easy to achieve. The reason for this easiness of the transformation is because it is the substrates that are bonded together.

In addition, the vertical arrangement of the second substrate 5 and the first substrate 1 may be reversed. That is, the second substrate 5 may be positioned under the first substrate 1 with the bonding surface 54 thereof facing upwards. In this case, the bonding surface 54 of the second substrate 5 is transformed into an upwardly curved surface to suppress the air bubbles from being mixed, and is gradually bonded starting from the center toward the periphery thereof to finally returned to the flat surface.

In addition, in order to carry out the bonding of the second substrate 5 and the first substrate 1 gradually from the center toward the periphery thereof, the second substrate 5 is first bent. However, the first substrate 1 may be first bent instead. In this case as well, the substrates are bonded to each other. Here, however, it is desirable from the viewpoint of protecting the chips 2A and 2B to keep the first substrate 1 flat and the chips 2A and 2B flat.

Figure 3:
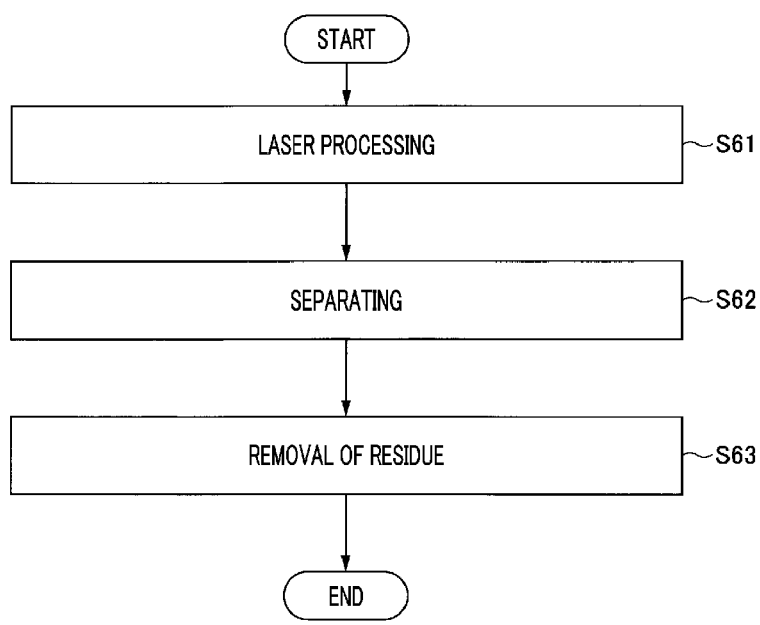
FIG. 3 is a flowchart showing details of a process S6 of FIG. 1.
Figure 4H:
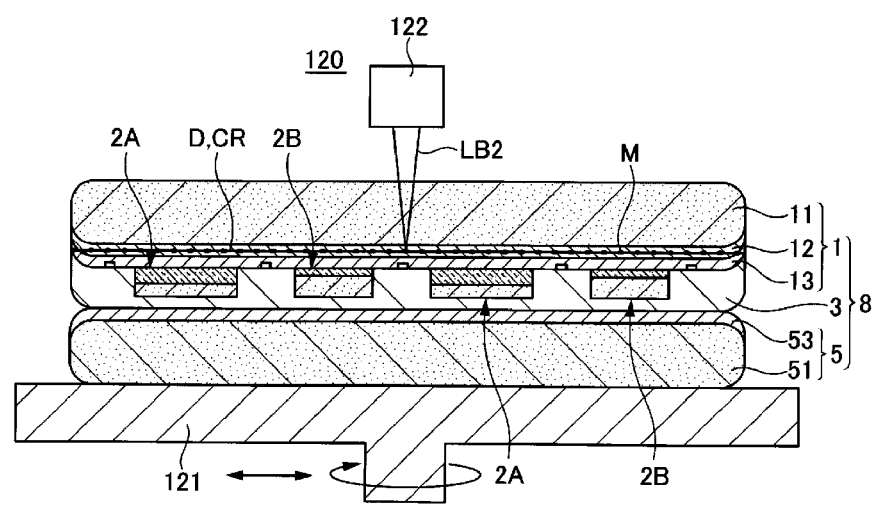
FIG. 4H is a cross sectional view illustrating a state upon the completion of a process S61 of FIG. 3 included in the process S6 of FIG. 1.
Figure 4I:
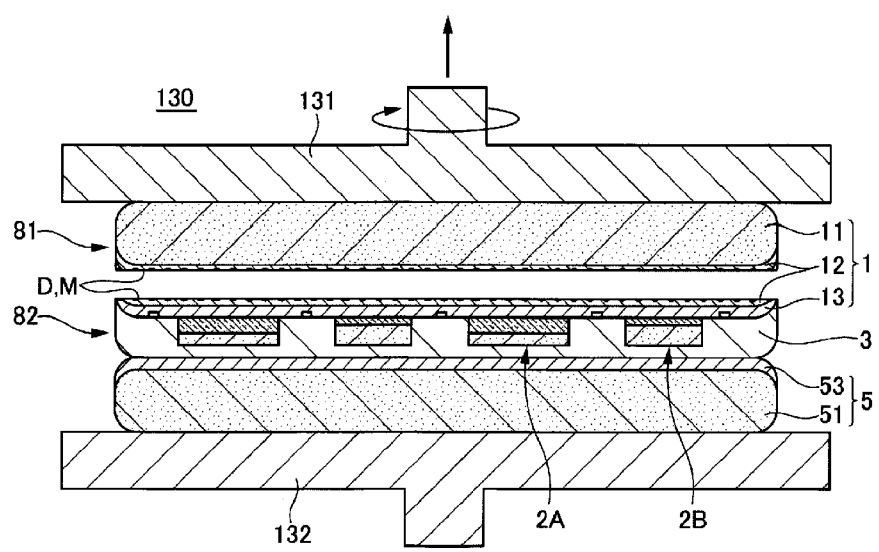
FIG. 4I is a cross sectional view illustrating a state upon the completion of a process S62 of FIG. 3 included in the process S6 of FIG. 1.
Figure 4J:
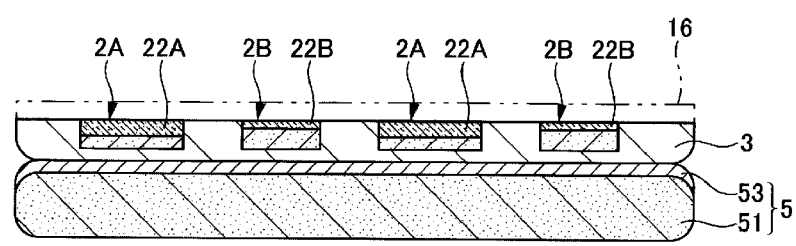
FIG. 4J is a cross sectional view illustrating a state upon the completion of a process S63 of FIG. 3 included in the process S6 of FIG. 1.

Next, in the process S6 of FIG. 1, the chips 2A and 2B are separated from the first substrate 1, as illustrated in FIG. 4H, FIG. 4I and FIG. 4J. As illustrated in FIG. 4H, in a process S61 of FIG. 3 included in the process S6 of FIG. 1, a modification layer M is formed by a laser beam LB2 in a separation surface D along which the first substrate 1 is to be separated in a thickness direction thereof. The modification layer M is formed in the shape of dots at condensing points or above the condensing points, for example.

The laser beam LB2 passes through the silicon wafer 11 of the first substrate 1 to form the modification layer M in the absorption layer 12 of the first substrate 1. The absorption layer 12 is disposed between the silicon wafer 11 and the chips 2A and 2B, and serves to absorb the laser beam LB2. Since the laser beam LB2 hardly reaches the chips 2A and 2B, the damage to the chips 2A and 2B can be suppressed.

In order to penetrate the silicon wafer 11 to be absorbed by the absorption layer 12, the laser beam LB2 has a wavelength ranging from, e.g., 8.8 μm to 11 μm. A light source of the laser beam LB2 is, for example, a $CO_2$ laser. The wavelength of the $CO_2$ laser is about 9.3 μm. The laser beam LB2 is oscillated in a pulse shape.

The position where the modification layer M is formed is moved by a galvano scanner or an XYθ stage. The galvano scanner moves the laser beam LB2. The XYθ stage moves the first substrate 1 in horizontal directions (an X-axis direction and a Y-axis direction), and rotates the first substrate 1 around a vertical axis. Instead of the XYθ stage, an XYZθ stage may be used.

The modification layer M is plural in number, and the multiple modification layers M are formed at intervals therebetween in a circumferential direction and a diametrical direction of the first substrate 1. When the modification layers M are formed, cracks CR connecting the modification layers M are also formed.

In a process S62 of FIG. 3 included in the process S6 of FIG. 1, the first substrate 1 is separated starting from the modification layers M, as depicted in FIG. 4I. First, an upper chuck 131 holds the first substrate 1, and a lower chuck 132 holds the second substrate 5. Here, however, the vertical arrangement of the first substrate 1 and the second substrate 5 may be reversed, so the upper chuck 131 may hold the second substrate 5, and the lower chuck 132 may hold the first substrate 1. Subsequently, if the upper chuck 131 is raised with respect to the lower chuck 132, the cracks CR spread in a planar shape starting from the modification layers M, so that the first substrate 1 is separated along the separation surface D.

In the process S62, the upper chuck 131 may be rotated around a vertical axis at the same time as it is raised. The first substrate 1 may be cut along the separation surface D. Further, instead of raising the upper chuck 131 or in addition to raising the upper chuck 131, the lower chuck 132 may be lowered. In addition, the lower chuck 132 may also be rotated around a vertical axis.

In a process S63 of FIG. 3 included in the process S6 of FIG. 1, a residue 16 of the first substrate 1 adhering to the chips 2A and 2B is removed by CMP or the like, as illustrated in FIG. 4J. The residue 16 includes the bonding layer 13 and a part of the absorption layer 12. Once the residue 16 is removed, the device layers 22A and 22B of the chips 2A and 2B are exposed again.

Figure 4K:
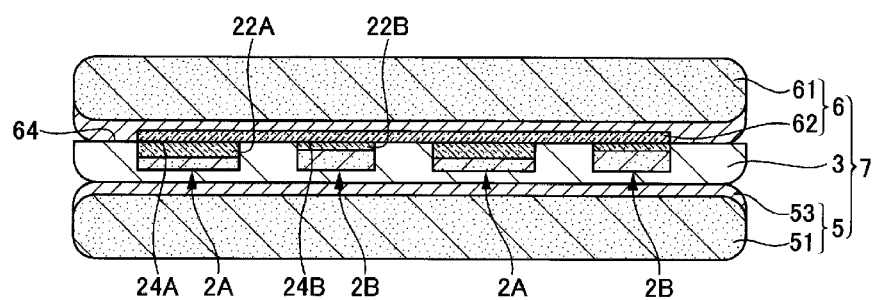
FIG. 4K is a cross sectional view illustrating a state upon the completion of a process S7 of FIG. 1.

Next, in a process S7 of FIG. 1, as illustrated in FIG. 4K, in the state that the chips 2A and 2B are bonded to the second substrate 5, the chips 2A and 2B are bonded to one surface 64 of the third substrate 6 including a device layer 62. The third substrate 6 includes a silicon wafer 61 and the device layer 62.

The device layer 62 is formed on a surface of the silicon wafer 61. The device layer 62 includes a semiconductor device, a circuit, a terminal, and the like, and is electrically connected to the device layers 22A and 22B of the chips 2A and 2B.

At least either the bonding surface 64 of the third substrate 6 or the bonding surfaces 24A and 24B of the chips 2A and 2B may be subjected to surface modification and hydrophilization prior to the bonding. The third substrate 6 and the chips 2A and 2B are bonded by a Van der Waals force (intermolecular force), a hydrogen bond between OH groups, and the like. Since the solids are directly attached to each other without using a liquid adhesive, the positional deviation that might be caused by the deformation of the adhesive or the like can be suppressed. Furthermore, it is possible to suppress the formation of the inclination due to the non-uniform thickness of the adhesive.

The third substrate 6 is bonded to the second substrate 5 with the bonding surface 64 facing downwards and the chips 2A and 2B therebetween. That is, the substrates are bonded to each other. At this time, in order to suppress the air bubbles from being mixed, the bonding surface 64 of the third substrate 6 is transformed into a downwardly curved surface, and is gradually bonded starting from a center toward a periphery thereof to finally return to a flat surface.

The transformation of the third substrate 6 can be achieved by fixing the periphery of the third substrate 6 and pressing the center of the third substrate 6. When the third substrate 6 is transformed, a distance between the fixed portion and the pressing portion is wide, as compared to the case where the chips 2A and 2B are transformed one by one. Thus, the transformation may be easily achieved. The reason for this easiness of the transformation is because it is the substrates that are bonded together.

In addition, the vertical arrangement of the third substrate 6 and the second substrate 5 may be reversed. That is, the third substrate 6 may be disposed under the second substrate 5 with the bonding surface 64 thereof facing upwards. In this case, in order to suppress the air bubbles from being mixed, the bonding surface 64 of the third substrate 6 is transformed into an upwardly curved surface, and is gradually bonded starting from the center toward the periphery thereof to finally return to a flat surface. In this case as well, the substrates are bonded together.

Furthermore, in order to carry out the bonding of the third substrate 6 and the second substrate 5 gradually from the center toward the periphery, the third substrate 6 is first bent. However, the second substrate 5 may be bent first. In this case as well, the substrates are bonded together.

Through the process S7, a chip-attached substrate 7 is obtained. The chip-attached substrate 7 includes the third substrate 6 and the plurality of chips 2A and 2B. The chip-attached substrate 7 further includes the second substrate 5. The second substrate 5 may be separated from the chips 2A and 2B, and the chip-attached substrate 7 may include only the third substrate 6 and the chips 2A and 2B.

As described above, according to the present exemplary embodiment, in producing the chip-attached substrate 7, the plurality of chips 2A and 2B are not bonded to one surface of the third substrate 6 one by one, but they are temporarily bonded to one surface of the first substrate 1. Since the mixing of the air bubbles at this stage is not a problem, the bonding surfaces 24A and 24B of the chips 2A and 2B can be bonded to the bonding surface 14 of the first substrate 1 while they are maintained flat. Since it is not needed to transform the chips 2A and 2B forcibly, the precision of the position control of the chips 2A and 2B can be improved, and the chips 2A and 2B can be placed at the target positions accurately.

Thereafter, the plurality of chips 2A and 2B bonded to the first substrate 1 are bonded to the surface of the second substrate 5 facing the first substrate 1. Subsequently, the plurality of chips 2A and 2B bonded to the first substrate 1 and the second substrate 5 are separated from the first substrate 1. Then, in the state that the plurality of chips 2A and 2B separated from the first substrate 1 are bonded to the second substrate 5, they are bonded to the one surface 64 of the third substrate 6 including the device layer 62.

At this time, in order to suppress the air bubbles from being mixed, the bonding surface 64 of the third substrate 6 is transformed into the downwardly curved surface, and is gradually bonded starting from the center toward the periphery thereof to finally return to the flat surface. The transforming of the third substrate 6 is easier than the transforming of the chips 2A and 2B one by one. This is because it is the substrates that are bonded to each other. Thus, as compared to the case described in Patent Document 1 where the chips 2A and 2B are permanently bonded to the third substrate 6 without taking the process of temporarily bonding the chips 2A and 2B to the first substrate 1, the chip-attached substrate 7 with no air bubbles mixed and with high position precision can be obtained.

Figure 5:
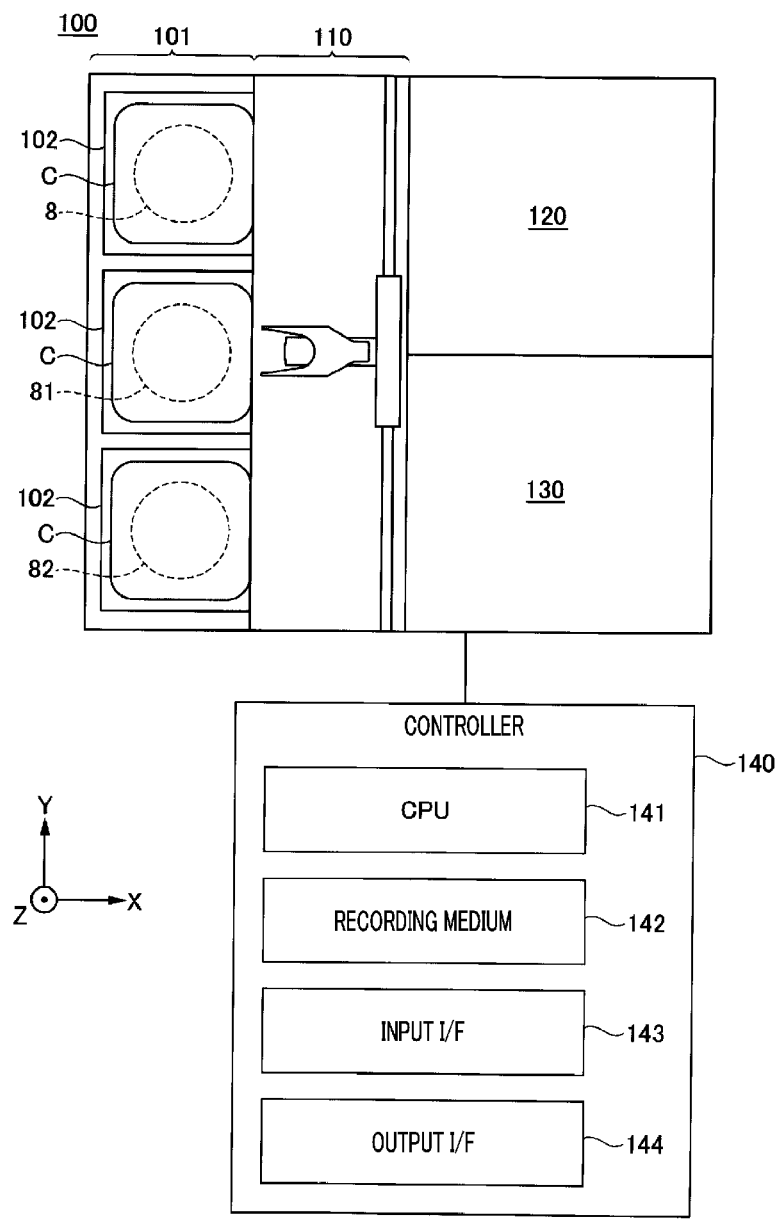
FIG. 5 is a plan view illustrating a substrate processing apparatus according to the exemplary embodiment.

Now, referring to FIG. 5, etc., a substrate processing apparatus 100 configured to perform the processes S61 and S62 of FIG. 3 will be explained. In FIG. 5, the X-axis direction, the Y-axis direction, and the Z-axis direction are orthogonal to each other, and the X-axis and Y-axis directions are horizontal directions, whereas the Z-axis direction is a vertical direction. The substrate processing apparatus 100 includes a carry-in/out section 101, a transfer section 110, a laser processing unit 120, a separating unit 130, and a controller 140.

The carry-in/out section 101 has placing units 102 in which cassettes C are disposed. The cassette C accommodates therein a plurality of stacked substrates 8 shown in FIG. 4G or the like while keeping the stacked substrates 8 apart from each other at a certain distance therebetween in a vertical direction. Each stacked substrate 8 includes the plurality of chips 2A and 2B, the first substrate 1, and the second substrate 5. The stacked substrate 8 is separated into a first separation body 81 and a second separation body 82 along the separation surface D, as illustrated in FIG. 4I. Then, the first separation body 81 and the second separation body 82 are accommodated in the separate cassettes C. The first separation body 81 includes the silicon wafer 11, and may be taken out of the substrate processing apparatus 100 to be reused as a new first substrate 1. Meanwhile, the second separation body 82 includes the chips 2A and 2B, and is sent to be subjected to the process S63 of FIG. 3 and the process S7 of FIG. 1 after being carried to the outside of the substrate processing apparatus 100. Here, the number of the placing units 102 and the number of the cassettes C are not limited to the example shown in FIG. 5.

The transfer section 110 is disposed next to the carry-in/out section 101, the laser processing unit 120, and the separating unit 130, and serves to transfer the stacked substrate 8 or the like therebetween. The transfer section 110 has a holding mechanism configured to hold the stacked substrate 8, or the like. The holding mechanism is configured to be movable in horizontal directions (both an X-axis direction and a Y-axis direction) and a vertical direction and pivotable around a vertical axis.

As shown in FIG. 4H, the laser processing unit 120 forms, by radiating the laser beam LB2, the plurality of modification layers M in the separation surface D along which the first substrate 1 is to be separated in the thickness direction. The modification layers M are formed in the shape of dots, and are formed at the condensing points or above the condensing points, for example. The laser processing unit 120 includes, for example, a stage 121 configured to hold the first substrate 1, and an optical system 122 configured to radiate the laser beam LB2 to the first substrate 1 held by the stage 121. The stage 121 is, for example, an XYθ stage or an XYZθ stage. The optical system 122 includes, for example, a condensing lens. The condensing lens condenses the laser beam LB2 toward the first substrate 1. The optical system 122 may further include a galvano scanner.

The separating unit 130 separates the first substrate 1 starting from the modification layers M, as shown in FIG. 4I. The separating unit 130 includes, by way of example, the upper chuck 131 and the lower chuck 132. The upper chuck 131 is configured to hold the first substrate 1, and the lower chuck 132 is configured to hold the second substrate 5. Here, however, the vertical arrangement of the first substrate 1 and the second substrate 5 may be reversed. Subsequently, if the upper chuck 131 is raised with respect to the lower chuck 132, the cracks CR spread in the planar shape starting from the modification layers M, so that the first substrate 1 is separated along the separation surface D. In other words, the stacked substrate 8 is separated into the first separation body 81 and the second separation body 82 along the separation surface D. Concurrently with the raising of the upper chuck 131, the upper chuck 131 may be rotated around a vertical axis. The first substrate 1 can be cut along the separation surface D.

The controller 140 is, for example, a computer, and is equipped with a CPU (Central Processing Unit) 141 and a recording medium 142 such as a memory, as shown in FIG. 5. The recording medium 142 stores therein a program for controlling various kinds of processings performed in the substrate processing apparatus 100. The controller 140 controls an operation of the substrate processing apparatus 100 by causing the CPU 141 to execute the program stored in the recording medium 142. In addition, the controller 140 is also equipped with an input interface 143 and an output interface 144. The controller 140 receives a signal from the outside through the input interface 143 and transmits a signal to the outside through the output interface 144.

The program is stored in, for example, a computer-readable recording medium, and installed from this recording medium to the recording medium 142 of the controller 140. The computer-readable recording medium may be, by way of non-limiting example, a hard disk (HD), a flexible disk (FD), a compact disk (CD), a magnet optical disk (MO), a memory card, or the like. In addition, the program may be downloaded from a server via the Internet and installed in the recording medium 142 of the controller 140.

So far, the manufacturing method for the chip-attached substrate and the substrate processing apparatus according to the exemplary embodiment have been described. However, the present disclosure is not limited to the above-described exemplary embodiment or the like. Various changes, corrections, replacements, addition, deletion and combinations may be made within the scope of the claims, and all of these are included in the scope of the inventive concept of the present disclosure.

This application claims priority to Japanese Patent Application No. 2019-196386, field on Oct. 29, 2019, which application is hereby incorporated by reference in their entirety.

According to the exemplary embodiment, it is possible to suppress the poor bonding between the chip and the substrate.

We claim:

1. A manufacturing method of a chip-attached substrate, comprising:
    preparing a stacked substrate including multiple chips, a first substrate to which the multiple chips are temporarily bonded, and a second substrate bonded to the first substrate with the multiple chips therebetween; and
    separating the multiple chips bonded to the first substrate and the second substrate from the first substrate to bond the multiple chips to one surface of a third substrate including a device layer,
    wherein the separating of the multiple chips from the first substrate comprises:
        forming, with a laser beam, multiple modification layers in a separation surface along which the first substrate is to be separated in a thickness direction thereof; and
        separating the first substrate starting from the multiple modification layers.

2. The manufacturing method of the chip-attached substrate of claim 1,
    wherein the first substrate includes a silicon wafer, and an absorption layer provided between the silicon wafer and the multiple chips to absorb the laser beam, and
    the laser beam passes through the silicon wafer and forms the multiple modification layers in the absorption layer.

3. The manufacturing method of the chip-attached substrate of claim 2, wherein the absorption layer is a silicon oxide layer.

4. The manufacturing method of the chip-attached substrate of claim 1,
    wherein the laser beam has a wavelength ranging from 8.8 µm to 11 µm.

5. The manufacturing method of the chip-attached substrate of claim 1,
    wherein the separating of the multiple chips from the first substrate further comprises removing a residue of the first substrate adhering to the multiple chips after the separating of the first substrate along the separation surface.

6. The manufacturing method of the chip-attached substrate of claim 1, further comprising:

bonding the multiple chips, which are separated from the first substrate, to the one surface of the third substrate including the device layer in a state that the multiple chips are bonded to the second substrate.

7. A manufacturing method of a chip-attached substrate, comprising:
   preparing a stacked substrate including multiple chips, a first substrate to which the multiple chips are temporarily bonded, and a second substrate bonded to the first substrate with the multiple chips therebetween;
   separating the multiple chips bonded to the first substrate and the second substrate from the first substrate to bond the multiple chips to one surface of a third substrate including a device layer;
   bonding the multiple chips one by one to one surface of the first substrate temporarily; and
   bonding the multiple chips, which are bonded to the first substrate, to a surface of the second substrate facing the first substrate.

8. The manufacturing method of the chip-attached substrate of claim 7, further comprising:
   thinning the multiple chips to uniform thicknesses thereof after the bonding of the multiple chips to the first substrate and before the bonding of the multiple chips to the second substrate.

9. The manufacturing method of the chip-attached substrate of claim 8, further comprising:
   forming, on surfaces of the multiple chips, a bonding layer configured to bond the multiple chips to the second substrate after the thinning of the multiple chips and before the bonding of the multiple chips to the second substrate.

10. The manufacturing method of the chip-attached substrate of claim 9, further comprising:
    planarizing a contact surface of the bonding layer to be brought into contact with the second substrate, after the forming of the bonding layer and before the bonding of the multiple chips to the second substrate.

11. A manufacturing method of a chip-attached substrate, comprising:
    bonding multiple chips one by one to one surface of a first substrate temporarily;
    bonding the multiple chips, which are bonded to the first substrate, to a surface of a second substrate facing the first substrate;
    separating the multiple chips, which are bonded to the first substrate and the second substrate, from the first substrate; and
    bonding the multiple chips, which are separated from the first substrate, to one surface of a third substrate including a device layer in a state that the multiple chips are bonded to the second substrate.

12. A substrate processing apparatus, comprising:
    a transfer unit configured to transfer a stacked substrate including multiple chips, a first substrate to which the multiple chips are temporarily bonded, and a second substrate bonded to the first substrate with the multiple chips therebetween;
    a laser processing unit configured to form, with a laser beam, multiple modification layers in a separation surface along which the first substrate is to be separated in a thickness direction thereof; and
    a separating unit configured to separate the first substrate starting from the multiple modification layers.

13. The substrate processing apparatus of claim 12, wherein the first substrate includes a silicon wafer, and an absorption layer provided between the silicon wafer and the multiple chips to absorb the laser beam, and the laser beam passes through the silicon wafer and forms the multiple modification layers in the absorption layer.

14. The substrate processing apparatus of claim 13, wherein the absorption layer is a silicon oxide layer.

15. The substrate processing apparatus of claim 13, wherein the laser processing unit comprises a $CO_2$ laser as a light source of the laser beam.

\* \* \* \* \*